United States Patent [19]
Ramachandran

[11] Patent Number: 6,074,935
[45] Date of Patent: *Jun. 13, 2000

[54] METHOD OF REDUCING THE FORMATION OF WATERMARKS ON SEMICONDUCTOR WAFERS

[75] Inventor: Ravikumar Ramachandran, Beacon, N.Y.

[73] Assignee: Siemens Aktiengesellschaft, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/882,057

[22] Filed: Jun. 25, 1997

[51] Int. Cl.[7] ...................... H01L 21/322; H01L 21/335; H01L 21/8232; B08B 3/04
[52] U.S. Cl. .......................... 438/476; 438/143; 438/471; 438/906; 134/26; 134/38; 134/39; 134/42
[58] Field of Search .................................... 438/143, 402, 438/471, 906, 974, 745, 758, 778, 782; 216/13, 83, 95; 510/109, 175, 499; 134/26, 38, 39, 42; 521/905; 526/939; 528/904

[56] References Cited

U.S. PATENT DOCUMENTS

| | | | |
|---|---|---|---|
| 4,795,582 | 1/1989 | Ohmi et al. | 252/79.3 |
| 5,259,888 | 11/1993 | McCoy | 134/2 |
| 5,628,833 | 5/1997 | McCormack | 134/26 |
| 5,772,781 | 6/1998 | Inada | 134/10 |
| 5,803,980 | 9/1998 | Pas | 134/2 |
| 5,807,439 | 9/1998 | Akatsu | 134/32 |
| 5,823,210 | 10/1998 | Inada | 134/105 |

OTHER PUBLICATIONS

Park, Jin–Goo; Effects of Drying Methods and Wettability of Silicon on the Formation of Water Marks in Semiconductor Processing; The Electrochemical Society, vol. 142 No. 6, pp. 2028–2031, Jun. 1995.

Lewis, Richard J.; Hawley's Condensed Chemical Dictionary; Van Hostrand Reinhold Co., p. 232, 1993.

"Surfactant Adsorption at the Solid–Liquid Interface–Dependence of Mechanism on Chain Length", P. Somasundaran et al., The Journal of Physical Chemistry, 68, pp. 3562–3566 (1964).

"Effect of Hot Water Exposure On Bare Silicon Surfaces In MOS Processing", J.H. Eisenberg et al., Mat. Res. Soc. Symp. Proc. vol. 315, pp. 484–489 (1993 Materials Research Society).

"First–Principles Study of the Etching Reactions of HF and H20 with Si/Si02 Surfaces", Krishnan Raghavachari, et al., Mat. Res. Soc. Symp. Proc. vol. 315, pp. 437–445 (1993) Mat. Res. Soc.).

"Dissolution Windows for Wet Chemical Processing of Silicon and Silicon . . . ," K. Osseo–Asare et al., Journal of the Electrochemical Society, vol. 143, No. 2, Feb. 1996, 749–751.

"Chemistry of the Solid–Water Interface, Processes at the Mineral–Water and Particle–Water Interface in Natural Systems", Werner Stumm, pp. 19–20.

"Cationic Surfactants", W.M. Linfield, Marcel Dekker, Inc. NY 1970, pp. 33–37.

"Hawley's Condensed Chemical Dictionary," 13th ed., Wiley & Sons, p. 32, 34. 1997.

*Primary Examiner*—Charles Bowers
*Assistant Examiner*—Nema Berezny
*Attorney, Agent, or Firm*—Stanton C. Braden

[57] ABSTRACT

A method for reducing the formation of watermarks includes providing a semiconductor wafer and contacting the semiconductor wafer with a solution containing a watermark reducing amount of at least one cationic surfactant.

19 Claims, No Drawings

METHOD OF REDUCING THE FORMATION OF WATERMARKS ON SEMICONDUCTOR WAFERS

TECHNICAL FIELD

Methods for reducing the formation of watermarks on semiconductor wafers are described herein. More particularly, the formation of watermarks on semiconductor wafers is reduced by contacting the wafer with a solution containing cationic surfactants.

BACKGROUND OF RELATED ART

During semiconductor chip manufacture, unintentional formation of surface defects on the semiconductor wafers is undesirable. Watermarks are one such defect unintentionally formed during wafer processing.

Generally, a semiconductor wafer has a silicon surface with a thin layer of oxide on the silicon. The oxide layer can be removed by subjecting the semiconductor wafer to a wet chemical processing step, e.g., a dilute hydrofluoric acid dip. After such processing, the semiconductor wafer is normally rinsed with deionized water to remove the chemicals used in the chemical processing step. However, silicon at the surface of the wafer can undergo dissolution upon contact with the deionized water to form the reaction product $Si(OH)_4$ in solution. When the rinsed semiconductor wafer is subsequently dried the silicon in solution precipitates back onto the surface of the semiconductor wafer, producing watermarks on the surface of the wafer.

The etching of silicon in the presence of dissolved oxygen in water is explained in Eisenberg et al., Surface Chemical Cleaning and Passivation for Semiconductor Processing, Materials Research Soc. Symp. Proc. No. 315, Pittsburgh, pp. 485–490 (1993) as follows: First, the Si—Si backbond is reacted with oxygen. Second, the silicon atoms attain a positive charge due to the electronegativity of the oxygen which initiates the reaction of $OH^-$ with the Si—Si backbond. The third step involves the release of $Si_xO_yH_z$ into the solution and the termination of the silicon bond with hydrogen. Unintentional etching of silicon and the formation of watermarks is a potential problem whenever an aqueous solution comes into contact with a bare or unprotected silicon surface.

It would be desirable to provide an easily implemented method of inhibiting silicon dissolution to reduce the formation of watermarks during wafer processing and thereby increase production yield of semiconductor chips.

SUMMARY OF THE INVENTION

Novel methods for reducing the formation of watermarks on semiconductor wafers have been discovered which include the steps of providing a semiconductor wafer and contacting the semiconductor wafer with a solution containing a watermark reducing amount of a cationic surfactant. The cationic surfactants, which adsorb on the wafer surface (particularly on any bare silicon surfaces), minimize the extent of water interaction with the wafer surface and help in reducing silicon dissolution, thereby minimizing the formation of watermarks.

In a particularly useful embodiment, the method involves providing a semiconductor wafer having a surface including oxide and bare silicon regions and increasing the hydrophobic properties to the surface of the wafer by contacting the surface of the semiconductor wafer with a fluid containing a watermark reducing amount of at least one cationic surfactant. The cationic surfactant(s) not only render the oxide regions hydrophobic, but also adsorb on the silicon regions and reduce the extent of water interaction with the wafer surfaces. The watermark reducing amount of cationic surfactant can then be removed by contacting the surface of the semiconductor wafer with an organic solvent.

DESCRIPTION OF THE INVENTION

The invention relates to substantially reducing formation of watermarks on a substrate during the fabrication of integrated circuits (ICs), including random access memories (RAMs), dynamic RAMs (DRAMs), synchronous DRAMs (SDRAMs), and logic devices. It is noted that typically, ICs are fabricated in parallel on a semiconductor substrate such as a wafer. Once processing is finished, the wafer is diced, separating the ICs into individual chips for packaging.

In accordance with the invention, a cationic surfactant is employed to increase the hydrophobic properties of the surface of the wafer. The cationic surfactant reduces or minimizes the amount of silicon dissolution in the deionized water used to rinse the wafer to remove chemicals used in a previous process. As a result, the likelihood that watermarks will be produced upon drying is reduced. The cationic surfactant can subsequently be rinsed using an organic solvent which does not dissolve silicon to any significant extent and therefore poses no threat of forming watermarks.

In one embodiment, the semiconductor wafer comprises, for example, silicon. Other types of semiconductor wafers, such as silicon-germanium and silicon on insulator (SOI), are also useful. The wafer includes a plurality of ICs fabricated thereon. The ICs can be in any stage of processing and, as such, the wafer comprises various different types of region. For example, the wafer comprises a plurality of oxide and bare silicon regions during processing to form the ICs. The oxide regions have hydrophilic properties and the bare silicon regions have generally hydrophobic properties.

The fabrication of semiconductor devices or ICs is typically conducted in successive stages, one or more of which can involve the forming of a pattern on the surface by lithographic techniques. Forming a pattern typically involves coating at least a portion of the substrate with a resist material, exposing in the appropriate pattern and developing the resist layer. Once the resist is developed, subsequent processing steps, e.g., etching, then can be performed to locally impart physical characteristics to the semiconductor material to yield a desired structure.

Etching can be achieved, for example, by a wet chemical processing. Typically, during such wet chemical processing, the surface of the semiconductor wafer is contacted with an acid, e.g., dilute hydrofluoric acid. Suitable parameters for patterning and wet chemical processing (e.g., choice of etchant, concentration of etchant, time, temperature, etc.) are well known.

Following the chemical processing step, the etched surface of the wafer is rinsed to stop the chemical processing by removing, diluting and/or neutralizing the etchant. One suitable rinsing fluid is deionized water. However, when deionized water contacts the wafer, it causes dissolution of silicon, particularly at the bare silicon regions. Upon drying, watermarks will result.

In accordance with one embodiment of the invention, an aqueous solution comprising a cationic surfactant is contacted with the wafer to reduce or prevent watermarks from forming. The solution, for example, can include organics to facilitate the preparation of the surfactants therein. The amount of cationic surfactant in the solution is sufficient to effectively reduce the formation of watermarks during subsequent drying. The solution can be applied to the wafer during etching as part of the etching solution. The solution can also be applied as a separate step prior to the rinsing of the wafer with deionized water or simultaneously with the application of the rinsing fluid to the wafer.

Cationic surfactants useful herein include any conventional cationic surfactants. In one embodiment, the cationic surfactants comprises alkyl amines. Suitable alkyl amines include, but are not limited to, those having alkyl chains comprising from 4 to 20 carbon atoms, preferably from 6 to 18 carbon atoms, and more preferably from 8 to 16 carbon atoms. Examples of such alkyl amines include butyl amine, pentyl amine, hexyl amine, heptyl amine, octyl amine, nonyl amine, decyl amine, dodecyl amine and the like. Preferred alkyl amines include those having alkyl chains containing 10, 12 or 14 carbon atoms such as, for example, decyl amine and dodecyl amine. Combinations of cationic surfactants are also useful.

In one embodiment, The amount of cationic surfactant that contacts with the wafer is sufficient to effectively reduce the formation of watermarks. What constitutes a sufficient amount depends on a number of factors. Such factors include, for example, the specific surfactant used, the size of the wafer, and the surface characteristics of the wafer. Typically, a watermark reducing amount ordinarily ranges from about 0.002 mM to about 40 mM, preferably from about 0.05 mM to about 20 mM, and more preferably from about 0.5 mM to about 2 mM. Generally, for alkylamines, the longer the chain length of the alkyl group(s), the lower the concentration of surfactant needed. Though not critical, the wafer should be contacted with the cationic surfactant solution for a time ranging from about 2 seconds to about 60 seconds, preferably from about 5 seconds to about 45 seconds, and more preferably from about 10 seconds to about 30 seconds. The temperature during contact with the surfactant solution need not be precisely controlled, but normally can range from about 5C. to about 50° C. and more preferably from about 15° C. to about 30° C.

After contacting the wafer with the cationic surfactant, any subsequent rinsing can be performed with deionized water alone, provided the cationic surfactant has not been removed from the wafer.

The cationic surfactant can be subsequently removed from the rinsed surface of the wafer, if desired. This can be achieved by contacting an organic solvent to the surface of the semiconductor wafer. Useful organic solvents include alcohols such as methanol, ethanol, propanol, isopropyl alcohol, butanol, isobutyl alcohol, and the like. Preferably, ethanol and isopropyl are used for removing the cationic surfactant. The use of alcohol as the organic solvent is advantageous to the removal process due to the complete solubility of the surfactant in the alcohol solution, which will limit any carbon residue or contamination problems.

The oxide regions of the wafer reportedly exhibit a negative charge at the pH level of the rinsing fluid (i.e., at a pH level greater than two) providing hydrophilic properties at those regions. The cationic surfactant, on the other hand, typically exhibits a positively charged head group and a hydrophobic tail.

While not wishing to be bound to any theory, it is believed that once the surfactant is contacted with the oxide region of the wafer, the surfactant will advantageously be adsorbed by the oxide. Specifically, it is believed that the positively charged head group of the cationic surfactant adsorbs to the negatively charged oxide surface. In this manner, the oxide region will now appear hydrophobic. On the bare silicon regions of the semiconductor wafer surface, it is believed that the surfactant will be adsorbed which will render the bare silicon region of the semiconductor wafer surface more hydrophobic and less susceptible to attack by water. Accordingly, it is postulated that the addition of the cationic surfactant will cause the entire surface of the semiconductor wafer to appear hydrophobic. In this manner water will be repelled from the surface of the wafer, thereby minimizing dissolution of silicon. This will inhibit the formation of watermarks caused by redeposition of dissolved silicon that might occur upon drying of the wafer.

While the invention has been described with reference to various illustrative embodiments, it will be apparent to those skilled in the art that many changes and variations are possible without departing from the scope and spirit thereof. The invention should therefore be determined not with reference to the above description but with reference to the appended claims along with the full scope of equivalents.

What is claimed is:

1. A method of inhibiting the formation of watermarks on a semiconductor wafer comprising the steps of:
    a) providing a semiconductor wafer having at least one region with hydrophilic properties; and
    b) contacting the semiconductor wafer with a solution comprising a watermark inhibiting amount of a cationic surfactant to cause the at least one region with hydrophilic properties to appear to be hydrophobic, wherein the cationic surfactant comprises an alkyl amine.

2. The method of claim 1 wherein the cationic surfactant is selected from the group consisting of alkyl amines where the alkyl group contains between 4 to 20 carbon atoms.

3. The method of claim 1 wherein the alkyl amine selected from the group consisting of decyl amine and dodecyl amine.

4. The method of claim 1 wherein the solution contains a cationic surfactant in an amount of from about 0.002 mM to about 40 mM.

5. The method of claim 1 wherein the solution is contacted with the wafer during a rinsing step.

6. The method of claim 1 further comprising the step of removing the cationic surfactant from the surface of the semiconductor wafer.

7. The method of claim 6 wherein the cationic surfactant is removed by contacting the wafer with an organic solvent.

8. The method of claim 7 wherein the organic solvent is an alcohol.

9. The method of claim 8 wherein the alcohol is selected from the group consisting of ethanol and isopropyl alcohol.

10. The method of claim 1 wherein step (a) comprises the step of wet chemical processing the semiconductor wafer.

11. The method of claim 1 wherein the at least one region having hydrophilic properties comprises an oxide on a surface of the semiconductor wafer.

12. The method of claim 11 wherein the oxide comprises silicon dioxide.

13. A method of reducing the formation of watermarks on a surface of a semiconductor wafer comprising the steps of:
    a) providing a semiconductor wafer having a surface including oxide and bare silicon regions; and
    b) increasing the hydrophobic properties to the surface of the wafer by contacting the surface of the semiconductor wafer with a solution containing a watermark reducing amount of at least one cationic surfactant, wherein the cationic surfactant is selected from the group consisting of alkyl amines.

14. The method of claim 13 wherein the alkyl amine is selected from the group consisting of decyl amine and dodecyl amine.

15. The method of claim 13 wherein the solution contains cationic surfactant in an amount of from about 0.002 mM to about 40 mM.

16. The method of claim 13 further comprising the step of removing the cationic surfactant from the wafer by contacting the surface of the wafer with an organic solvent.

17. The method of claim 16 wherein the organic solvent is an alcohol.

18. The method of claim 16 wherein the alcohol is selected from the group consisting of ethanol and isopropyl alcohol.

19. A method for reducing the formation of watermarks on a semiconductor wafer, comprising the steps of:

producing a solution comprising a watermark reducing amount of at least one cationic surfactant selected from the group consisting of alkyl amines; and contacting the solution with a surface of the semiconductor wafer to increase hydrophobic properties at least one region of the surface of the semiconductor wafer.

* * * * *